(12) United States Patent
Wort et al.

(10) Patent No.: US 7,837,793 B2
(45) Date of Patent: Nov. 23, 2010

(54) METHOD OF MANUFACTURING DIAMOND SUBSTRATES

(75) Inventors: Christopher John Howard Wort, Oxfordshire (GB); Daniel James Twitchen, Berkshire (GB); Geoffrey Alan Scarsbrook, Berkshire (GB)

(73) Assignee: Element Six Limited, Ballasalla (IM)

( * ) Notice: Subject to any disclaimer, the term of this patent is extended or adjusted under 35 U.S.C. 154(b) by 1096 days.

(21) Appl. No.: 10/566,275

(22) PCT Filed: Jul. 26, 2004

(86) PCT No.: PCT/IB2004/002391

§ 371 (c)(1),
(2), (4) Date: Jul. 20, 2006

(87) PCT Pub. No.: WO2005/010245

PCT Pub. Date: Feb. 3, 2005

(65) Prior Publication Data

US 2007/0034147 A1    Feb. 15, 2007

Related U.S. Application Data

(60) Provisional application No. 60/492,736, filed on Aug. 6, 2003.

(30) Foreign Application Priority Data

Jul. 30, 2003    (GB) ................................ 0317854.8

(51) Int. Cl.
*C30B 35/00* (2006.01)
(52) U.S. Cl. ....................... 117/200; 117/929
(58) Field of Classification Search ....................... None
See application file for complete search history.

(56) References Cited

U.S. PATENT DOCUMENTS

| 5,127,983 | A | * | 7/1992 | Imai et al. ................... 117/85 |
| 5,198,070 | A | | 3/1993 | Jones |
| 5,420,443 | A | | 5/1995 | Dreifus |
| 5,474,021 | A | * | 12/1995 | Tsuno et al. .................. 117/97 |
| 5,642,779 | A | * | 7/1997 | Yamamoto et al. .......... 165/185 |
| 5,672,240 | A | | 9/1997 | Stoner et al. |
| 5,791,045 | A | * | 8/1998 | Yamamoto et al. ....... 29/890.03 |
| 5,907,768 | A | | 5/1999 | Malta et al. |

(Continued)

FOREIGN PATENT DOCUMENTS

EP    0 589 464    3/1994

(Continued)

*Primary Examiner*—Allan Olsen
(74) *Attorney, Agent, or Firm*—Oblon, Spivak, McClelland, Maier & Neustadt, L.L.P.

(57) ABSTRACT

A tiled array of diamond plates, which is suitable for wafer scale processing, for example, in the manufacture of electronic or other device structures on the diamond plates. The diamond plates are fixed to a support layer, preferably a polycrystalline diamond support layer, in a substantially planar arrangement such that at least one of the major surfaces of the respective fixed diamond plates defines a fabrication surface that is exposed for further processing. The support layer may be a backing layer, in which case only one of the major faces of the diamond substrate is exposed for further processing, or may extend between respective diamond substrates such that both major surfaces are exposed for further processing.

30 Claims, 1 Drawing Sheet

U.S. PATENT DOCUMENTS

| | | |
|---|---|---|
| 6,353,204 B1 * | 3/2002 | Spaay et al. ........... 219/121.72 |
| 6,562,127 B1 | 5/2003 | Kud et al. |
| 2004/0229464 A1 * | 11/2004 | Godfried et al. ............ 438/689 |
| 2005/0109267 A1 * | 5/2005 | Linares et al. ................ 117/68 |
| 2005/0109268 A1 * | 5/2005 | Linares et al. ................ 117/68 |
| 2007/0034147 A1 * | 2/2007 | Wort et al. .................. 117/929 |

FOREIGN PATENT DOCUMENTS

| | | |
|---|---|---|
| JP | 8-208387 | 8/1996 |
| WO | 03/005443 | 1/2003 |

* cited by examiner

METHOD OF MANUFACTURING DIAMOND SUBSTRATES

BACKGROUND OF THE INVENTION

THIS invention relates to a method of manufacturing single crystal diamond substrates for use in device applications, and to diamond wafers for use in such a method.

Diamond offers a range of unique properties, including optical transmission, thermal conductivity, stiffness, wear resistance and electronic properties. Whilst many of the mechanical properties of diamond can be realised in more than one type of diamond, other properties are very sensitive to the type of diamond used. For example, for the best electronic and other properties, CVD single crystal diamond is important, often outperforming polycrystalline CVD diamond, HPHT diamond and natural diamond.

There are many applications where the workable area or surface of the final diamond product is very small. In such applications it is often difficult to achieve economies of scale or to provide practical methods of processing the single crystal diamond substrates into the desired devices. Thus, for example, the manufacture of electronic devices on the surfaces of small individual diamond substrates is problematic. Conventional lithographic techniques and existing lithography equipment are not suited to realising some of the complex electronic structures envisaged for such single crystal diamond substrates.

SUMMARY OF THE INVENTION

According to the invention, a diamond wafer assembly for use in a method of processing single crystal diamond substrates comprises a plurality of single crystal diamond plates fixed to a support layer, preferably a polycrystalline diamond support layer, in a substantially planar arrangement such that at least one of the major surfaces of the respective fixed diamond plates defines a fabrication surface that is exposed for further processing.

The support layer may be a backing layer, in which case only one of the major faces of the single crystal diamond substrate is exposed for further processing. Alternatively, the support layer may extend between respective single crystal diamond substrates such that both major surfaces are exposed for further processing.

The invention further extends to such diamond wafer assemblies used for subsequent processing of the single crystal diamond substrates into device structures using wafer scale techniques.

The invention also extends to a method of producing single crystal diamond substrates, in particular for device applications and more particularly for electronic applications, which method includes the steps of providing a plurality of single crystal diamond plates, each diamond plate having a pair of opposite major surfaces, one or both of the major surfaces defining a fabrication surface, fixing the diamond plates in a substantially planar array to a support layer to form a diamond wafer assembly, and processing as required the fabrication surfaces to produce respective single crystal diamond substrates.

The single crystal diamond substrates are suitable for subsequent forming of device structures on the fabrication surfaces.

The support layer is preferably a polycrystalline diamond layer. The polycrystalline diamond layer may be bonded to the plurality of crystal diamond plates, collectively or individually, by any appropriate adhesive means such as, for example, gluing or brazing. In bonding the support layer to the single crystal diamond plates, it is to be understood that this encompasses bringing the support layer into contact with the single crystal diamond plates and vice versa. Particularly preferred, however, is that the polycrystalline diamond layer is grown onto the plurality of single crystal diamond plates, thereby forming direct diamond-to-diamond bonding between layer and plates.

The processing of the fabrication surfaces will typically be to provide for electronic or other device features on the fabrication surfaces.

The diamond wafer assembly can be separated into the individual single crystal diamond plates and individual devices, or groups thereof, for example by cleavage or laser cutting of the polycrystalline diamond or other support layer between the single crystal diamond substrates and, where required, by cleavage of the single crystal diamond substrates along appropriately formed grooves or by other means.

The diamond wafer assembly is preferably dimensioned so as to be suitable for use in conventional lithography techniques using existing lithography equipment.

The invention also extends to a processed diamond wafer assembly, comprising one or more processed single crystal diamond plates embedded in a polycrystalline diamond support layer or bonded to that layer by diamond to diamond bonding or another form of carbon only bonding, wherein the polycrystalline diamond support layer has a greater area than the one or more processed single crystal diamond plates. The polycrystalline diamond support layer provides one or more of mechanical support, thermal heatsinking, electrical isolation, or enhanced electrical breakdown properties for the processed diamond wafer assembly, such that the processed diamond wafer assembly can be used in an application selected from optical, thermal, mechanical, electrical, electronic and combinations thereof.

Figure 1:
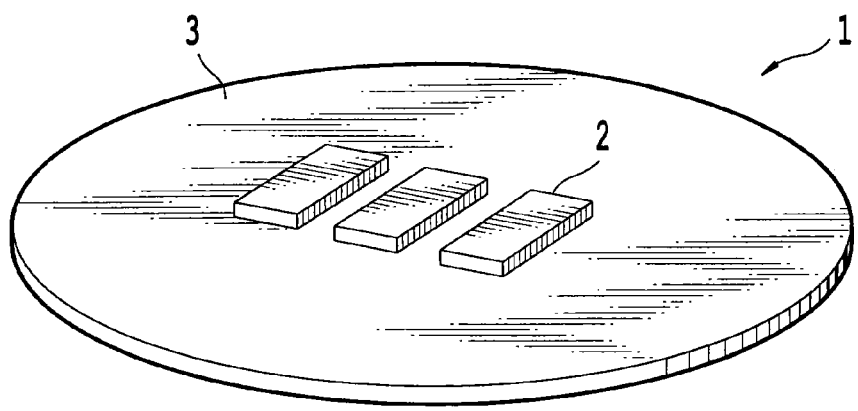
FIG. 1 A plurality of single crystal diamond plates fixed to a support layer with a single fabrication surface exposed for further processing.
Figure 2:
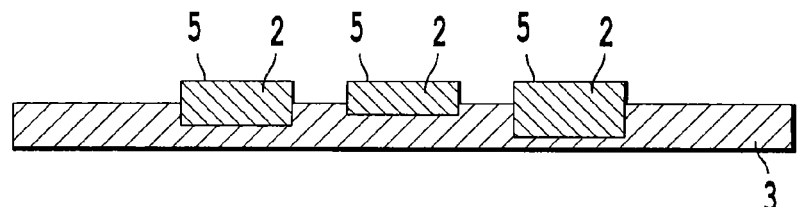
FIG. 2 Cross section through FIG. 1 showing single crystal diamond plates fixed to the support layer, each single crystal diamond plate having a single surface exposed to define a fabrication surface.
Figure 3:
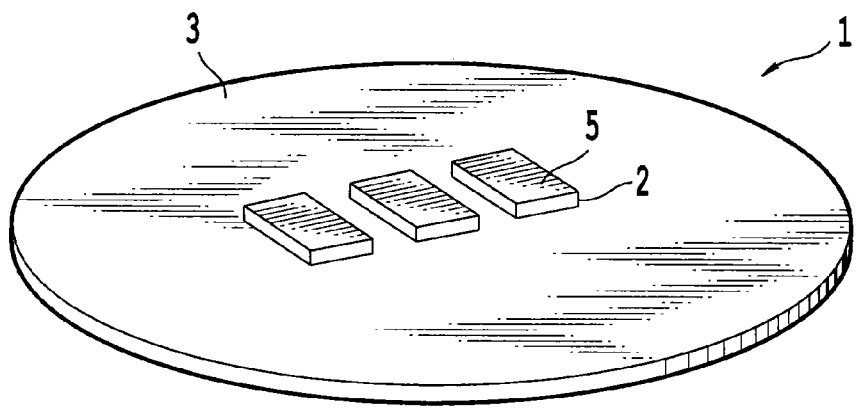
FIG. 3 A plurality of single crystal diamond plates fixed to a support layer with two fabrication surface exposed for further processing.
Figure 4:
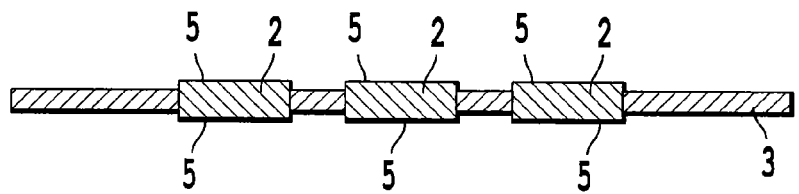
FIG. 4 Cross section through FIG. 3.

1=diamond wafer assembly
2=single crystal diamond plate
3=support layer
5=fabrication surface exposed for further processing

DESCRIPTION OF PREFERRED EMBODIMENTS

The invention is directed to providing a tiled array of diamond plates, which is suitable for wafer scale processing, for example, in the manufacture of electronic or other device structures on the diamond plates.

In order to be suitable for wafer scale processing, the diamond plates are preferably single crystal diamond plates. These single crystal diamond plates are preferably either CVD diamond having an accessible upper major surface, and possibly an accessible lower major surface, or alternatively present an accessible upper surface with the lower surface attached to and covered by the support layer. For example where the support layer is polycrystalline diamond the upper major face may be surrounded by a layer of polycrystalline CVD diamond, whilst the lower major face may be coated with and bonded to the support layer of polycrystalline CVD diamond.

The accessible surface(s) of each plate, which have been suitably prepared for use in the fabrication of device structures, typically one or both of the major faces, are referred to as the "fabrication surface(s)". These fabrication surfaces are required to fall within a defined tolerance of a single conceptual plane, such that the fabrication surface of each plate within a wafer may be further processed by wafer scale techniques such as those described later. Thus, for instance, where photolithographical techniques are to be applied with a single plane of optical focus, the tolerance of the fabrication surfaces to the conceptual plane should be less than about 100 µm, preferably less than about 25 µm, more preferably less than about 10 µm, even more preferably less than about 5 µm, and most preferably less than about 3 µm. Where mechanical processing techniques are to be applied to the respective fabrication surfaces, for instance, it is preferable that the fabrication surfaces fall within a defined tolerance of a single conceptual plane which is less than about 5 µm, preferably less than about 2 µm, more preferably less than about 1 µm, even more preferably less than about 0.5 µm, and most preferably less than about 0.2 µm. In the case of both the upper and lower surfaces presenting a fabrication surface, each fabrication surface preferably includes the above features.

The single crystal diamond plates or tiles are preferably arranged in an array such that the fabrication surface intended for use on each diamond plate is in an arrangement regular in the sense that it repeats from wafer to wafer, such that jigs for constructing the array and lithography masks or other wafer processing equipment are equally valid for each wafer. A preferred embodiment is where the regularity of the arrangement extends to the arrangement on a single wafer, such that the position of each plate can be described in terms of a regular two dimensional lattice, in a manner akin to atoms in a material lattice. In principle more than one plate can be associated with each lattice point, and each plate associated with a particular lattice point can be of a different geometry, but a preferred embodiment is the case when each single crystal plate is the same shape, and a further preferred embodiment is where there is only one single crystal diamond substrate plate associated with each lattice point.

One preferred embodiment is where the single crystal diamond plates are arranged to butt together in a well aligned array, or more preferably to be spaced apart by a small predetermined spacing. The small predetermined spacing is sufficient to avoid contact damage during mounting or thermal cycling, but not so large as to substantially reduce the total packing density on the backing or support layer. This spacing also avoids the problem of dimensional errors in one plate affecting the positioning of those in direct contact with it. Another preferred embodiment is where, in addition, the plates are all rectangular in form. In yet a further embodiment, the single crystal diamond plates are arranged in a well aligned array and significantly spaced apart from one another by a relatively large predetermined spacing.

Those skilled in the art will understand that the existence of small defects in the geometry of individual plates, or in the positioning of individual plates in the array, do not invalidate the general concept of the regular array provided that such defects do not substantially degrade the yield obtainable in the final wafer scale processing.

In one version of the invention, the array of single crystal diamond plates or tiles is bonded to a backing layer, in particular a polycrystalline diamond layer, which provides matched thermal expansion and good thermal heatsinking during the processing thereof. The bond between the backing layer and the individual tiles can be provided in any appropriate manner such as gluing or brazing. However, in order to assist in the function of the diamond wafer, it should exhibit one or more of a high thermal conductivity, stability under high process temperature, for example up to 1100° C., and high mechanical strength to enable wafer scale mechanical processing. Brazing is acceptable for processing temperatures up to about 1100° C., and provides relatively good thermal conductivity and mechanical strength.

The single crystal plates may be bonded to the backing layer in a number of ways. For instance, the single crystal diamond plates can be put into an array, the mounting surface of each single crystal diamond coated with the means of adhesion, such as a braze or glue, the backing wafer brought into contact with the single crystal diamond plates (or visa versa), and then, if necessary, the means of adhesion activated by whatever means, for example by heating the assembly. Alternatively, the single crystal diamond plates can be put into an array, the means of adhesion positioned suitably on the backing wafer, either as discrete points or a continuous layer, the backing wafer brought into contact with the single crystal diamond plates (or visa versa) and, if necessary, the means of adhesion activated by whatever means, for example by heating the assembly. The excess means of adhesion can be removed, for example, by using solvents or an etching process, if this is deemed necessary.

As a further alternative, the backing layer may be prepared and the means of adhesion positioned suitably on the backing wafer either as discrete points or a continuous layer. The single crystal diamond plates can then be put individually onto the backing layer, using for example pick and place machinery or other means to position the single crystals according to the desired array, and then, if necessary, the means of adhesion activated by whatever means, for example by heating the assembly. As yet another alternative, the mounting surface of each single crystal diamond can be coated with the means of adhesion, and then these assemblies put individually onto the backing layer, using for example pick and place machinery or other means to position the single crystals according to the desired array, and then, if necessary, the means of adhesion activated by whatever means, for example by heating the assembly.

After the single crystal diamond plates have been bonded, for example by brazing onto a backing wafer, such as silicon or tungsten or polycrystalline diamond or a combination of these, where the backing layer is chosen to be compatible with further diamond growth, a layer of polycrystalline diamond can be grown from the front face (which is a fabrication face) of the single crystal diamond array. The growth conditions used can be such as to provide single crystal diamond on the front faces of the single crystal diamond substrates compatible with the application, or the diamond grown in these regions can be subsequently removed, for example by being polished off, or the device faces of the single crystal diamond substrates can be suitably masked to suppress diamond growth in these regions. Once this stage of diamond growth is completed the initial backing layer may be retained in application or may be removed by etching or other means. In this last case, the final configuration is one where the single crystal diamond plates may be exposed on both surfaces of the supporting polycrystalline diamond surface. This may be beneficial, for example allowing device structures to be completed on both surfaces or the device to be the bulk of the single crystal diamond layer with contacts from both surfaces.

In an alternative version of the invention, which is a particularly preferred version of the invention, a backing layer, preferably a layer of polycrystalline diamond, is grown or otherwise formed onto the back surface of the array of single crystal diamond plates.

a) In the case of a polycrystalline diamond layer, this method forms direct diamond to diamond bonding, or another form of carbon only bonding, the key feature being that the single crystal diamond plates and the polycrystalline diamond are intimately bonded without an interlayer of non-carbon material between them and that the bonding provides a substantial proportion of the beneficial thermal, electrical, mechanical and other properties of a continuous diamond layer. Other benefits in application are that the thermal expansion match of the joint between the array of single crystals and their supporting layer is perfect, that there are no other materials present that could cause contamination to subsequent processes, and that the dielectric match between the backing or support layer and the array of single crystal diamond plates is the same.

b) Alternatively, the backing layer could be a heat sensitive material, such as a thermoplastic or low melting point metal, a setting material such as a resin, or a deposited material other than CVD diamond, such as produced by solvent deposition or chemical vapour deposition.

A preferred embodiment is the use of chemical vapour deposition to form a layer of CVD polycrystalline diamond. In this instance the surface on which the array of single crystal plates is placed may act as the hetero-nucleation medium for the polycrystalline diamond, and its exact profile may control the top surface profile of the combined single crystal diamond/polycrystal diamond structure. For example, tungsten or silicon may be used as a flat plate, with the final device face of the single crystal substrates bonded directly to the tungsten by brazing and a conformal coating of polycrystalline diamond grown over the top. Normally growth onto single crystal diamond provides further single crystal growth. However, it may be advantageous to encourage polycrystalline diamond nucleation, which can be achieved in a number of ways. For example, a flash layer of titanium or other metal may be put onto the mounting faces of the single crystal diamond before or after mounting onto the tungsten plate, or the CVD diamond growth may be initiated with a very high methane level to generate multiple nucleation, or the mounting surface of the single crystal diamond can be mechanically roughened by, for example, lapping, or any combination of these and other techniques can be used.

A further embodiment comprises using a temporary carrier for the stage of coating the mounting face of the single crystal diamond with the polycrystalline diamond where that temporary carrier has a profiled face to modify the final composite surface away from flat. For example, an array of pockets separated by ridges would both position the single crystal plates and provide means to control the growth of the polycrystalline diamond so as to provide a non-flat final combination of the single crystal device faces and the upper surface of the polycrystalline diamond layer. Silicon can have a particular advantage in this method of preparation, since micromachining techniques make built production of the profiled surface a simple bulk operation and chemical etching to remove the silicon is relatively simple.

It is preferred to use a set of single crystal diamond plates that are similar in size and shape to assist in mounting them into an array. However the required tolerances are much less than would be the case for a set of plates intended to butt together in a continuous array that is used for overgrowing a single diamond crystal without discernible boundaries on top. Likewise, aligning a series of non-contacting plates is easier than ensuring precise alignment and uniform regular contact between an array of contacting tiles. Furthermore, in the present invention, an error with one tile position, shape or orientation affects only that tile, and does not affect the other tiles in the diamond wafer.

It is envisaged that the application of the diamond wafer may often benefit from the plates all presenting a physical orientation of minor or major faces within set limits. In order to achieve this, one method is to prepare a single edge and/or a single major face of each of the plates in a manner suitable with the necessary precision, and place this feature in contact with an alignment feature during the process of bonding the plates into an array, or use it for reference in pick and place methods. In the case of a major face, where only one face is to be processed, this aligned face, which would become the fabrication surface, may be placed against a reference plane during the process of bonding the plates and any non uniformity in the rear surfaces will be taken up by the bonding process.

Preferably the use of an edge or minor face of the single crystal diamond plates would provide alignment of the minor faces of the plates in the plane parallel to the surface of the backing layer to within a spread (defined as 95% of all plates mounted falling within the range of +/−the spread value about some common direction lying in the plane) of 10°, and more preferably 5°, and most preferably 2°. Preferably the use of major faces of the single crystal diamond plates would provide alignment of fabrication faces of the plates with respect to the plane parallel to the surface of the backing layer to within a spread (defined as 95% of all plates mounted falling within the cone with the given half angle about the normal to the plane of the backing layer) of 5°, and more preferably 2°, and more preferably 1°, and most preferably 0.5°.

It is also envisaged that the application of the diamond wafer may often benefit from the plates all presenting a similar crystallographic orientation within set limits. In order to achieve this, it is generally only necessary to prepare a single edge and/or a single major face of each of the plates with the necessary precision with respect to the crystal orientation of the plate. In the case of an edge this would be placed in contact with an alignment feature during the process of bonding the plates into an array, or used for reference in pick and place methods. In the case of a major face, where only one face is to be processed, this aligned face, which would become the fabrication surface, may be placed against a reference plane during the process of bonding the plates and any non uniformity in the rear surfaces will be taken up by the bonding process.

Preferably the use of an edge or minor face of the single crystal diamond plates would provide alignment of the crystallographic orientation of the plates in the plane parallel to the surface of the backing layer to within a spread (defined as 95% of all plates mounted falling within the range of +/−the spread value about some common direction lying in the plane) of 10°, and more preferably 5°, and most preferably 2°. Preferably the use of major faces of the single crystal diamond plates would provide alignment of the crystallographic orientation of the plates with respect to the plane parallel to the surface of the backing layer to within a spread (defined as 95% of all plates having the same plane normal falling within the cone with the given half angle about the normal to the plane of the backing layer) of 5°, and more preferably 2°, and more preferably 1°, and most preferably 0.5°.

An important application of the diamond wafer assembly of the invention is to provide a means for batch processing of the single crystal diamond plates bonded to it. An important requirement is thus that the layout on the wafer is predetermined, and can be repeated from one wafer to the next, so for example that processing masks or instructions for direct write processes can be set up and used for multiple wafers without modification. In principle this does not require any particular symmetry on an individual wafer, just repeatability from one wafer to the next, but a degree of symmetry or regularity in the packing of an individual wafer generally leads to more efficient packing and ease of use. Furthermore, the diamond wafer assembly is preferably suitable for use in wafer handling equipment, for the automatic processing of the wafers. To assist in this the diamond wafer assembly may have a feature, such as a small flat on one edge, or other aperture, cutout or machine readable marking, to enable automatic determination of its relative orientation in such wafer handling equipment. Such a machine readable feature should provide orientation of the diamond wafer assembly about the axis normal to the wafer which is within a spread (defined as the orientation of 95% of all plates being within +/−the spread value) of 5°, and more preferably 2°, and more preferably 1°, and most preferably 0.5°.

The bonding of the array of single crystal diamond plates together with a polycrystalline diamond layer is preferred, as it provides excellent thermal expansion matching between the mounting and the individual plates, ensures maximum thermal conductivity, has a very high temperature stability enabling much higher temperature processes to be used on the plates, and has similar chemical inertness to the single crystal diamond plates so that aggressive chemistries can be used. In addition, following device fabrication onto the surfaces of the individual diamond plates making up the wafer, the device can simply be removed from the wafer by snapping through the polycrystalline diamond layer between the single crystal diamond plates, although laser cutting may be preferred The combination of single crystal diamond plates bonded to polycrystalline CVD diamond can give unique advantages. This is particularly the case in one further preferred embodiment of the invention, where the single crystal diamond plates are deliberately widely spaced, which then provides each separate single crystal diamond or group of single crystal diamond plates with a substantial attached backing (or in this case surrounding) layer. This provides, for example, a much larger area for thermal heatsinking than merely the footprint of the individual single crystal diamond plates, or enhanced electrical isolation where the device is used in, for example, high voltage or high power electronics. Whilst direct bonding of the polycrystalline CVD diamond to the single crystal diamond is generally preferred, this form of application still has merit where other forms of bonding known in the art, for example glues or brazes, are used. In such cases, the bonded polycrystalline backing layer could be further grown in situ to embed the single crystal diamond plates therein. Whilst the backing layer used In this arrangement is preferably polycrystalline diamond, other forms of backing layer can also be used where appropriate.

For the purposes of this specification, the term 'device structures' referring to the structures fabricated onto a surface of the single crystal diamond substrates, refers to any heterogeneous or non-planar structure fabricated into or onto a surface of the single crystal diamond substrate in order to provide or modify the functionality as an electric device, electronic device, optical or mechanical device of which in final application the diamond forms an integral part. By way of non-limiting examples the following may be considered: implanted doping for heater tracks, grooves provided for mechanical or thermal isolation, or for fibre positioning, such as may be used with laser diode arrays, simple or complex electronic devices, from a simple pi junction with contact metallisation, to multi-layer, multi-material, and/or multi-contact devices, optical elements such as micro lenses, micro mirrors for electro-optic or opto-electronic applications, and mechanical constructions such as beams, suspended masses and the like such as may be used in electromechanical devices such as accelerometers, pressure sensors and the like.

The processing steps to produce device structures generally fall into two categories, those which are wafer scale in a simultaneous sense, and those which are wafer scale in a sequential sense.

Examples of wafer scale processes in a simultaneous sense include providing one or more metal layers combined with lithographic techniques and, for example, wet etching or dry plasma etching, to construct electrical contacts to the diamond. Other examples include further diamond coatings, such as doped diamond, to provide contact means or active elements of a device, or uniformly distributed ion implantation processes, and non-diamond coatings such as other semiconductor materials which may provide functional elements in the final devices.

Examples of sequential wafer scale processing include ion implantation using a scanning beam to write device features, where the ion implanter can be pre-programmed to automatically process the entire array of single crystal plates on an individual wafer in a sequential fashion. Similar examples are laser processing, to cut tracks in overlayers or into the diamond itself, and ion beam milling for the fabrication of small detail in devices.

Depending on the relative size of the single crystal diamond substrates and the desired device, there may be one or more devices fabricated into each single crystal diamond substrate. Where more than one device is so formed, one of the wafer scale processes may be the provision of grooves such as those cut by laser into the single crystal substrates to provide means for separation of the devices subsequently, for example by cleavage along said grooves.

A further variant of the invention is where the single crystal plates bonded together by a polycrystalline diamond backing layer or support layer, are used as groups of plates in a further stage of processing or in the final application, still bonded together by said backing layer or support layer. These groups may include any number of the single crystal plates from more than one to the complete assembly of plates formed as the original wafer. In this variant of the invention, the processing of the single crystal plates once in the wafer form is optional, and may include steps such as providing uniform optical polish on one or even both major faces of the plates. In order to retain the strength of the plate assembly and yet enable the rear faces to be polished, the plates may be more widely separated to enable bonding to occur in between the plates rather than across the rear faces, for example so that during the synthesis of the polycrystalline diamond backing layer the wider spaced plates enable growth species to move into the gaps between the plates and form a polycrystalline diamond layer in this location. It may be advantageous to use means such as a backing layer to avoid the growth of the polycrystalline diamond layer onto the rear major face of the plates in this application. Final applications making use of such assemblies of plates Include specialist heat sinks, complex sensor and electrical or electro-optic device applications, and multi-window optical applications. The surrounding polycrystalline diamond may then be an integral part of the function of the device assembly, for example providing a larger area for heat sinking, or additional high voltage isolation.

Those skilled in the art will recognize that there are a number of further variations by which the object of this invention can be realized. For example the backing wafer need not be a single layer, but can be a layer of polycrystalline diamond on silicon. In this case the silicon may be removed on final application leaving the single crystal diamond bonded to the polycrystalline diamond layer only.

The invention will now be illustrated by way of the following non-limiting examples:

EXAMPLE 1

A set of HPHT single crystal plates were prepared to the following criteria:
a) all the plates were selected from material showing no gross defects or strongly strained regions;
b) all <100> edged plates with no missing corners reducing the <100> edge length by >15%;
c) all <100> edges between 3.8 and 4.0 mm;
d) all exposed major facets (the fabrication surface) within 2° of the {100};
e) all plates with their opposing major faces parallel to within 3°, and an overall thickness of 0.6 mm +/−0.02 mm;
f) all plates with one reference edge aligned to the <100> direction to better than 3°; and
g) the fabrication surface finished to an Ra of <10 nm and prepared in a manner suitable for subsequent electronic use.

The reverse surfaces of the single crystal plates that formed the array were lapped to a surface finish of >200 nm to improve bonding to the subsequent polycrystalline diamond layer.

These single crystal plates were then placed into a prepared alignment mount which caused the individual plates to be closely packed but separated by a small 0.3 mm gap in a well aligned array. The lapped surfaces were placed uppermost. The mount was then placed into a CVD diamond reaction chamber and polycrystalline CVD diamond was formed onto the lapped surface of the array. Although in this example the polycrystalline diamond layer was 350 μm thick, the thickness of the polycrystalline layer can range from 1 or 2 μm through to several mm, if so desired.

Once the array was joined together by the polycrystalline diamond layer it was far more robust and could be handled as a single wafer, no longer requiring the mount to hold the individual crystals together.

The polycrystalline layer can be lapped or polished if required and the array of single crystal surfaces can also be further polished if so required by the subsequent processing steps.

The diamond wafer so produced is suitable for the further processing of the fabrication surfaces to produce single crystal diamond substrates suitable for electronic devices to be applied thereto.

EXAMPLE 2

A set of CVD single crystal plates were prepared using the method revealed in patent application WO 01/96633, and then processed to the criteria marked a)-g) in Example 1. The reverse surfaces and edges of the single crystal plates were lapped to a surface finish of about 1 μm.

These single crystal plates were then placed into a prepared alignment mount fabricated from silicon, which caused the individual plates to be separated by 1.2 cm in a well aligned array using separating ridges 200 μm above the plane on which the crystals were positioned, using a thin layer of thermally conductive paste to temporarily bond and heatsink the plates. The lapped surfaces were placed uppermost. The methods of providing microstructures in silicon wafers are well known to those in the art and provide accurate alignment of the features with the crystal orientation of the wafer.

The mount was then placed into a CVD diamond reaction chamber and polycrystalline CVD diamond was formed onto the lapped surface of the array, using a high methane concentration initially to enhance polycrystalline diamond nucleation on the lapped single crystal surface. The polycrystalline diamond layer was grown to a thickness of 800 μm thickness, then the exposed diamond face planarised by lapping, and a machine readable orientation flat processed by laser machining onto the diamond wafer assembly using the original Si wafer orientation flat as a reference. This enabled the physical orientation of the individual single crystal diamond plates to be set to within 2° spread and, with an orientation spread of <1° for the wafer assembly with respect to the automated wafer handling equipment, within 3° of the orientation of features provided by the automatic wafer handling equipment. Likewise, this procedure enabled the crystallographic orientation of the individual single crystal diamond plates to be set to within a 4° spread and, with an orientation spread of <1° for the wafer assembly with respect to the automated wafer handling equipment, within 5° of the orientation of features provided by the automatic wafer handling equipment.

The device faces of the single crystal plates were then exposed by etching off the silicon. For the purposes of testing, a variety of simple heating element devices were then produced in or on the device surface of the single crystal diamond plates using a combination of implantation, etching by ion beam and by plasma, masking, and further CVD synthesis steps to evaluate bulk processing capabilities and to provide B doped conductive heating tracks and contact pads.

The polycrystalline layer was then divided between the single crystal plates using a laser and the thermal behaviour of the system then tested. The polycrystalline diamond layer being directly bonded to the single crystal layer provided much better and more consistent heat sinking capability than similar structures using an intermediate braze or other form of bonding and would enable higher power devices to run at lower temperatures.

EXAMPLE 3

A set of CVD single crystal plates were prepared using the method revealed in patent application WO 01/96633, and then processed to the criteria marked a)-g) in Example 1 with the addition that both major faces were prepared suitable for electronic use. One face of each single crystal plate was then coated with a layer of material to aid recovering that face later. Materials used included silicon and tungsten, and techniques used included evaporation and sputtering, with layers typically 5-15 μm thick. The edges of the single crystal plates were then lapped to a surface finish of about 2 μm to assist polycrystalline diamond nucleation.

Each batch treated with a different surface recovery coating was then separately placed into a prepared alignment mount fabricated from silicon, which caused the individual plates to be separated by 1.2 cm in a well aligned array using separating ridges 100 μm above the plane on which the crystals were positioned, using a thin layer of thermally conductive paste to temporarily bond and heatsink the plates, with the coated surfaces exposed. The assembly was then placed into a CVD diamond reaction chamber and a polycrystalline CVD diamond layer was grown between and over the array of crystals, using a high methane concentration initially to enhance polycrystalline diamond nucleation on the lapped single crystal surface. The polycrystalline diamond layer was grown to a thickness of 650 µm. On removal from the reactor the non-planar polycrystalline diamond surface overlaying the surface recovery coating was then planarised by lapping, and then further thinned to expose the surface recovery coating. This final thinning was in some instances by lapping and in some instances using hot metal thinning, which used the surface recovery coating as a natural etch stop. Finally, the surface recovery coating was removed from the single crystal plates by chemical etching. This provided a polycrystalline diamond layer about 480 µm thick with embedded single crystal diamond plates exposed on both surfaces, with both surfaces of the single crystal already suitably prepared for electronic applications. The method provided the physical orientation of the major faces of the plates within a spread of 2° of the plane defined by the backing layer, and likewise because of the initial preparation of the substrates, provided the crystallographic orientation of the major faces of the plates within a spread of 4° of the plane defined by the backing layer (i.e. the {100} of at least 95% of the plates was within 4° of the plane of the backing layer and the diamond wafer assembly of which it formed a part).

Three types of device were then fabricated from these structures. The first was optical windows with anti-reflection coatings, where the AR coating could be fabricated across the entire array as one batch. The second was detector devices where the charge pickup and contact pads could be fabricated on both sides of the single crystal plates using wafer scale technology. The third device type was an optically or electron beam activated high voltage switch, again processed using wafer scale processes.

The polycrystalline diamond layer was separated by laser to provide individual and small groups of single crystal plates surrounded by a polycrystalline diamond frame for final device testing.

The additional polycrystalline frame provided a) a means of mounting and cooling the single crystal diamond window, b) a means of mounting and improving handling of the detector, and of providing detector arrays, and c) a means of providing useful electrical isolation against the risk of flashover for the high voltage switch.

EXAMPLE 4

A set of CVD single crystal plates were prepared using the method revealed in patent application WO 01/96633, and then processed to the criteria marked a)-g) in Example 1.

The sides and reverse surfaces of the single crystal plates were lapped to a surface finish of >500 nm to improve bonding to the subsequent polycrystalline diamond layer and the plated device placed face down in an array onto a sticky or tactile surface to retain their positioning. Braze paste was placed onto each of the plates, and then the lapped surface of a polycrystalline diamond wafer brought into contact and the whole assembly heated to the melting point of the braze paste (about 800° C.) to form a single wafer array of single crystal diamond plates suitable for further batch processing.

EXAMPLE 5

A set of HPHT single crystal plates were prepared with thin (20 µm) thick device quality CVD diamond grown onto one surface using the method revealed in patent application WO 01/96633, and then the plates processed to the criteria marked a)-g) in Example 1. The back face of each plate was lapped to >500 nm.

A polycrystalline CVD diamond disc was produced 100 mm in diameter and 300 µm thick on top of a silicon wafer, and then the surface lapped flat to a 5 µm Ra. A second silicon wafer was prepared without the polycrystalline diamond coating.

Each wafer was then processed as follows:

A braze paste was applied to the lapped face of each of the single crystal diamond plates and then using pick and place technology each was positioned onto the wafer. When the wafer was fully populated with the array of single crystal diamond plates a compressor plate was brought in contact with the upper surface of the single crystal diamond plates to ensure correct height/flatness and then the assembly was heated sufficient to melt the braze and affix the single crystal diamond plates to the wafer to form a single wafer array of single crystal diamond plates suitable for further batch processing.

The invention claimed is:

1. A diamond wafer assembly for use in a method of processing single crystal diamond substrates, comprising a plurality of single crystal diamond plates fixed to a support layer in a substantially planar arrangement such that both of the major surfaces of the respective fixed single crystal diamond plates define fabrication surfaces that are simultaneously exposed for further processing.

2. The diamond wafer assembly according to claim 1, wherein the single crystal diamond plates are arranged in a predetermined array.

3. The diamond wafer assembly according to claim 1, wherein a predetermined array is regular and based on a two dimensional array of lattice points with one or more plates associated with each lattice point.

4. The diamond wafer assembly according to claim 1, wherein the single crystal diamond plates are arranged to butt together in a well-aligned array.

5. The diamond wafer assembly according to claim 1, wherein the support layer is a polycrystalline CVD diamond support layer.

6. The diamond wafer assembly according to claim 1, wherein the single crystal diamond plates are CVD diamond plates.

7. The diamond wafer assembly according to claim 1, wherein the diamond wafer assembly is suitable for automatic wafer handling equipment and provides an orientation feature which is machine readable and provides orientation of the diamond wafer assembly about its normal axis within certain limits.

8. The diamond wafer assembly according claim 7, wherein the machine readable orientation feature enables orientation to be achieved within a spread of 5°.

9. The diamond wafer assembly according to claim 1, wherein the single crystal diamond plates are arranged in a well-aligned array and spaced from one another by a predetermined spacing.

10. The diamond wafer assembly according to claim 9, wherein the support layer comprises a backing layer that extends into the spacing between the respective single crystal diamond plates so as to embed at least a portion of the single crystal diamond plates in the support layer.

11. The diamond wafer assembly according to claim 1, wherein the assembly can be separated into one or more single crystal diamond substrates in which the support layer has a greater area than the single crystal diamond substrate(s).

12. The diamond wafer assembly according to claim 11, wherein the single crystal diamond substrates attached to the support layer can be used in optical, thermal, mechanical or electronic applications, or combinations thereof.

13. The diamond wafer assembly according to claim 1, wherein the single crystal diamond plates are bonded to the support layer by an adhesive means.

14. The diamond wafer assembly according to claim 13, wherein the single crystal diamond plates are bonded to the support layer by glue or a metal braze.

15. The diamond wafer assembly according to claim 13, wherein the single crystal diamond plates are bonded to the support layer by diamond-to-diamond bonding.

16. The diamond wafer assembly according to claim 1, wherein the single crystal diamond plates are arranged in a predetermined array and their physical alignment with respect to the wafer is within defined limits.

17. The diamond wafer assembly according to claim 16, wherein the physical orientation of the single crystal diamond plates comprises alignment of fabrication faces of the plates with respect to the plane parallel to the surface of the backing layer to within a spread of 5°.

18. The diamond wafer assembly according to claim 16, wherein the physical orientation of the single crystal diamond plates parallel to the plane of the support layer lies within a spread of 10°.

19. The diamond wafer assembly according to claim 18, wherein the physical orientation of the single crystal diamond plates parallel to the plane of the support layer lies within a spread of 5°.

20. The diamond wafer assembly according to claim 1, wherein the single crystal diamond plates are arranged in a predetermined array and their crystallographic alignment with respect to the wafer is within defined limits.

21. The diamond wafer assembly according to claim 20, wherein the crystallographic orientation of the single crystal diamond plates comprises alignment of fabrication faces of the plates with respect to the plane parallel to the surface of the backing layer to within a spread of 5°.

22. The diamond wafer assembly according to claim 20, wherein the crystallographic orientation of the single crystal diamond plates parallel to the plane of the support layer lies within a spread of 10°.

23. The diamond wafer assembly according to claim 22, wherein the crystallographic orientation of the single crystal diamond plates parallel to the plane of the support layer lies within a spread of 5°.

24. The diamond wafer assembly according to claim 1, wherein the respective fabrication surfaces fall within a defined tolerance of a single conceptual plane.

25. The diamond wafer assembly according to claim 24, wherein the tolerance of the respective fabrication surfaces to the conceptual plane is less than about 100 µM.

26. The diamond wafer assembly according to claim 25, wherein the tolerance of the respective fabrication surfaces to the conceptual plane is less than about 10 µm.

27. The diamond wafer assembly according to claim 26, wherein the tolerance of the respective fabrication surfaces to the conceptual plane is less than about 5 µm.

28. The diamond wafer assembly according to claim 27, wherein the tolerance of the respective fabrication surfaces to the conceptual plane is less than about 3 µm.

29. The diamond wafer assembly according to claim 28, wherein the tolerance of the respective fabrication surfaces to the conceptual plane is less than about 1 µm.

30. The diamond wafer assembly according to claim 29, wherein the tolerance of the respective fabrication surfaces to the conceptual plane is less than about 0.2 µm.

* * * * *